(12) United States Patent
Houdebine et al.

(10) Patent No.: US 10,135,451 B2
(45) Date of Patent: Nov. 20, 2018

(54) METHOD AND DEVICE FOR DOUBLING THE FREQUENCY OF A REFERENCE SIGNAL OF A PHASE LOCKED LOOP

(71) Applicant: STMicroelectronics SA, Montrouge (FR)

(72) Inventors: Marc Houdebine, Crolles (FR); Sebastien Dedieu, La Terrasse (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 15/800,302

(22) Filed: Nov. 1, 2017

(65) Prior Publication Data
US 2018/0269886 A1 Sep. 20, 2018

(30) Foreign Application Priority Data
Mar. 15, 2017 (FR) ..................... 17 52114

(51) Int. Cl.
    *H03L 7/197*    (2006.01)
    *H04L 7/033*    (2006.01)
    *H03L 7/089*    (2006.01)

(52) U.S. Cl.
CPC .......... *H03L 7/1974* (2013.01); *H03L 7/0891* (2013.01); *H04L 7/0331* (2013.01); *H03L 2207/10* (2013.01)

(58) Field of Classification Search
CPC ............... H03L 2207/10; H03L 7/1974; H03L 7/0891; H04L 7/0331
See application file for complete search history.

(56) References Cited

U.S. PATENT DOCUMENTS

| | | | |
|---|---|---|---|
| 6,720,806 B1* | 4/2004 | Merrill | H03K 5/00006 327/116 |
| 9,553,714 B2* | 1/2017 | Ahmad | H04L 7/0016 |
| 2008/0136468 A1 | 6/2008 | Li et al. | |

(Continued)

OTHER PUBLICATIONS

IEEE Std 802.15.1—2005, IEEE Standard for Information Technology—Telecommunications and Information Exchange Between Systems—Local and Metropolitan Area Networks-Specific Requirements, Part 15:1 Wireless Medium Access Control (MAC) and Physical Layer (PHY) Specifications for Wireless Personal Area Networks (WPANs):, IEEE Computer Society, Sponsored by the LAN/MAN Standards Committee, Jun. 14, 2005, 600 pages.

(Continued)

*Primary Examiner* — Sophia Vlahos
(74) *Attorney, Agent, or Firm* — Slater Matsil, LLP

(57) ABSTRACT

In some embodiments, a phase locked loop includes a voltage-controlled oscillator whose output is fed back to a first input of a phase comparator via a fractional divider controlled by a delta-sigma modulator. The method of doubling the frequency of the initial reference signal of the phase locked loop involves generating, from the initial reference signal and the output signal furnished by the voltage-controlled oscillator, a secondary reference signal having edges of a first type synchronized with each of the rising and falling edges of the initial reference signal and edges of a second type between the edges of the first type, and a furnishing of the secondary reference signal at a second input of the phase comparator operating on the edges of the first type.

20 Claims, 4 Drawing Sheets

(56) References Cited

U.S. PATENT DOCUMENTS

2012/0074995 A1\* 3/2012 Zhang .................. H03L 7/0898
                                                    327/156
2014/0340132 A1   11/2014 Terrovitis
2015/0326236 A1\* 11/2015 Thiagarajan ......... H03L 7/0814
                                                    375/221
2017/0187364 A1\* 6/2017 Park .................... H03K 5/1565

OTHER PUBLICATIONS

IEEE Standard for Low-Rate Wireless Networks, IEEE Computer Society, Sponsored by the LAN/MAN Standards Committee, IEEE Standard 802.15.4—2015, 708 pages.

Zhou, et al., "A Double-Edge-Triggered Phase Frequency Detector for Low Jitter PLL", Microelectronic Center, Harbin Institure of Technology, Harbin 150001, China, 2006 IEEE, 3 pages.

Huh, H. et al., "Comparison Frequency Doubling and Charge Pump Matching Techniques for Dual-Band ?? Fractional-N Frequency Synthesizer", IEEE Journal of Solid-State Circuits, vol. 40, No. 11, Nov. 2005, 10 pages.

Siriburanon, T. et al., "A 28-GHz Fractional-N Frequency Synthesizer with References and Frequency Doublers for 5G Cellular", Tokyo Institute of Technology, DMC R&D Center, IEEE Sep. 14-18, 2015, 4 pages.

\* cited by examiner

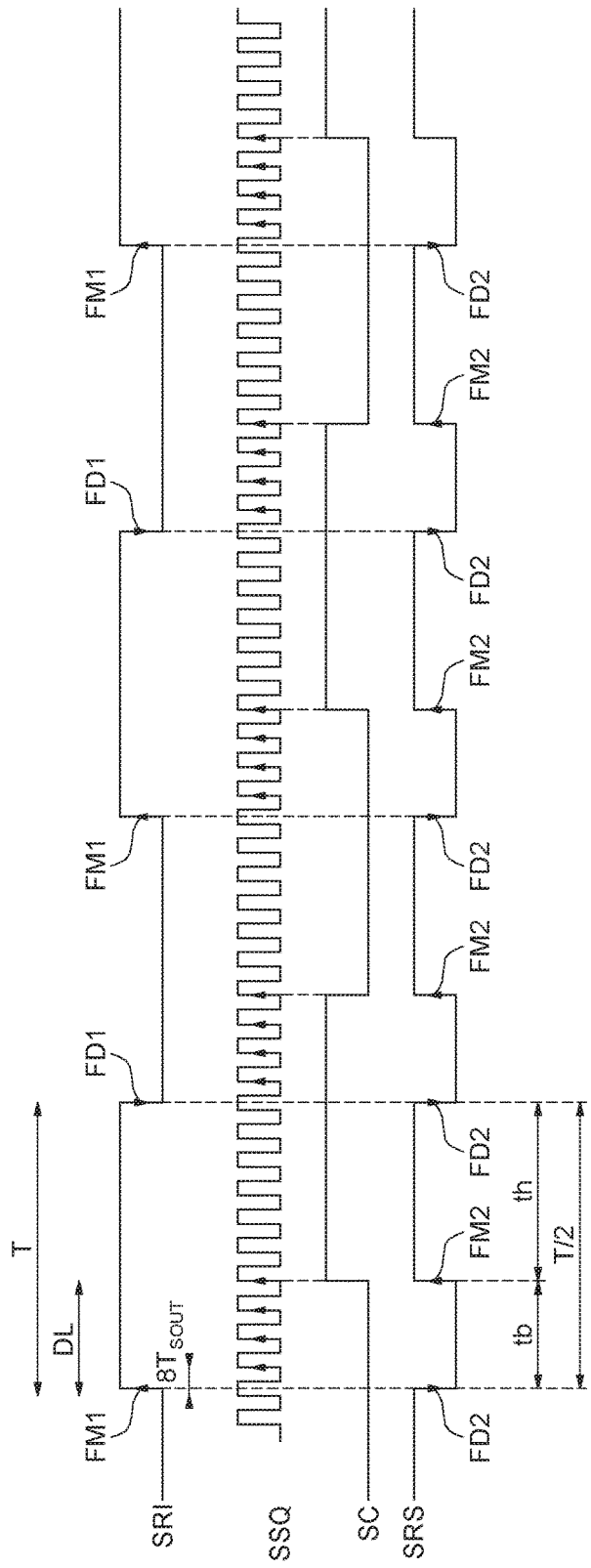

METHOD AND DEVICE FOR DOUBLING THE FREQUENCY OF A REFERENCE SIGNAL OF A PHASE LOCKED LOOP

CROSS-REFERENCE TO RELATED APPLICATIONS

This application claims priority to French Patent Application No. 1752114, filed on Mar. 15, 2017, which application is hereby incorporated herein by reference.

TECHNICAL FIELD

The present invention relates generally to an electronic device, and in particular embodiments, to a method and device for doubling the frequency of a reference signal of a phased locked loop (PLL).

BACKGROUND

When the reference signal of the fractional phase locked loop has a frequency which is too low compared to the frequency of the output signal provided by the voltage-controlled oscillator of the phase locked loop, the phase locked loop may not properly filter the noise resulting from the delta-sigma modulation. The noise, therefore, may appear in the output spectrum of the signal provided by the voltage-controlled oscillator.

This is the case, for example, in the BLE (Bluetooth Low Energy) standard, where the signal provided by the oscillator of the loop has a frequency of 2.4 GHz and the reference signal of this loop has a frequency of 16 MHz.

It has been observed that one solution involved doubling the frequency of the reference signal.

A classical solution for obtaining a double frequency consists in using the phase locked loop with two phase comparators operating respectively on the rising edges and the falling edges of the reference signal instead of a single phase comparator (phase frequency detector).

However, such architecture results in the presence of many contributions to the phase noise. Furthermore the signal of 32 MHz so produced is not usable by other devices that might be present in the integrated circuit incorporating this fractional phase locked loop with double phase comparator.

SUMMARY

Thus, there is a need to propose a method and a device enabling the doubling of the reference frequency of a fractional phase locked loop controlled by a delta-sigma modulation that has a limited number of phase noise contributions, low power consumption, and no need for a minimum working frequency.

In some embodiments, a method relates to the doubling of the frequency of a signal, particularly a signal having great spectral purity in the presence of a signal of elevated frequency having a low spectral purity.

Some embodiments apply particularly but not exclusively to the doubling of the frequency of a reference signal of a fractional phase locked loop controlled by a delta-sigma modulator.

Some embodiments may also be applied for example to radio frequency signal transmitters/receivers complying with the standard IEEE 802.15.1 (Bluetooth) or the standard IEEE 802.15.4 (Zigbee) or those complying with communication protocols of the near field type (NFC: Near Field Communication).

According to one aspect, there is a method for doubling the frequency of an initial reference signal of a phase locked loop.

This loop includes a voltage-controlled oscillator whose output is fed back to a first input of a phase comparator via a fractional divider controlled by a delta-sigma modulator.

The method according to this aspect involves generating, from the initial reference signal and the output signal furnished by the voltage-controlled oscillator, a secondary reference signal having edges of a first type, such as falling edges, synchronized with each of the rising and falling edges of the initial reference signal, and edges of a second type, such as rising edges, between the edges of the first type.

The method furthermore involves furnishing of the secondary reference signal at a second input of the phase comparator operating on the edges of the first type, for example, operating on the falling edges.

Thus, one uses a single phase comparator and generates the secondary reference signal, for example a signal of 32 MHz, from the initial reference signal, for example 16 MHz, and the output signal of the voltage-controlled oscillator.

One obtains a substantial reduction in the phase noise contributions.

Furthermore, even though the output signal of the oscillator contributes to the generating of the secondary reference signal, that is, the reference signal which has the double frequency as compared to the initial reference signal, the phase noise contributed by the oscillator is non-existent.

In fact, the edge generated by the output oscillator is not involved in the phase noise since the edge used by the phase comparator, which only operates on a single type of edge, is not directly this edge, but, instead, the edge of the secondary reference signal. On the other hand, as will be explained below, the signal generated by the output oscillator is advantageously utilized to obtain a pulse preferably broad enough to allow an effective operation of the phase comparator.

Of course, the phase comparator can be a phase comparator operating on rising edges, or a phase comparator operating on falling edges.

In order to further improve the efficiency of the doubling of frequency, the duty cycle of the secondary reference signal is advantageously greater than or equal to 20% and advantageously less than or equal to 80%, and preferably equal to or close to 50%.

The duty cycle here, for example, is the ratio between the duration of the secondary reference signal in the high state and the duration of the period of this secondary reference signal.

According to one embodiment, the generating of the secondary reference signal is done based on the initial reference signal, the inverted initial reference signal and a control signal that is generated from the output signal provided by the voltage-controlled oscillator and which is configured to select the initial reference signal or the inverted initial reference signal.

For example, one could select a control signal delayed by a delay equal to $$\frac{(1-\alpha) \cdot T}{2}$$

with respect to the initial reference signal, where α denotes the duty cycle of the secondary reference signal and T the period of the initial reference signal, or delayed by a delay equal to $$\frac{(1-\alpha) \cdot N \cdot T_{SOUT}}{2}$$

with respect to the output signal provided by the voltage-controlled oscillator, where $T_{SOUT}$ denotes the period of the output signal provided by the voltage-controlled oscillator and N is the ratio $T/T_{SOUT}$.

In other words, the control signal is delayed by a delay equal to the duration of the secondary reference signal in the low state.

According to one embodiment, the generating of the control signal involves a division of the output signal of the voltage-controlled oscillator so as to obtain a timing signal and a furnishing of the initial reference signal at the input of a shift register timed by the timing signal, the output of the shift register providing the control signal.

This shift register can be formed by at least one latch D or, preferably in order to avoid meta-stability problems, by a series of several latches D.

This method of doubling of frequency finds its full advantages in particular when the ratio of the frequency of the output signal of the voltage-controlled oscillator (for example, equal to 2.4 GHz) to the frequency of the initial reference signal (for example 16 MHz) is at least equal to 100.

In fact, it is generally in this case that the quantization noise of the delta-sigma modulator becomes a not insignificant, or even a degrading noise contribution. It is thus possible to reduce, for example by 15 dB, its noise contribution at the output of the loop by multiplying the frequency of the initial reference signal by two.

Thus, when the initial reference signal is doubled, one then obtains in the case of the BLE standard, for example, a frequency ratio of 75, which makes it possible to minimize or even totally eliminate the delta-sigma modulation noise.

According to another aspect, an electronic device is proposed, including an input to receive an initial reference signal, a phase locked loop including a voltage-controlled oscillator whose output is fed back to a first input of a phase comparator via a fractional divider controlled by a delta-sigma modulator, and signal generators coupled to the input and to the output of the voltage-controlled oscillator and configured to generate a secondary reference signal having edges of a first type synchronized with each of the rising and falling edges of the initial reference signal and edges of a second type between the edges of the first type, and to furnish the secondary reference signal at a second input of the phase comparator configured to operate on the edges of the first type.

According to one embodiment, the signal generators include an inverter coupled to the input to furnish the inverted initial reference signal, a controller configured to generate a control signal from the output signal furnished by the voltage-controlled oscillator, and a selector controlled by the control signal and configured to select the initial reference signal or the inverted initial reference signal in order to furnish the secondary reference signal.

According to one embodiment, the controller are configured to generate a control signal delayed by a delay equal to $$\frac{(1-\alpha) \cdot T}{2}$$

in relation to the initial reference signal, where a denotes the duty cycle of the secondary reference signal and T is the period of the initial reference signal.

According to one embodiment, the controller include a divider configured to perform a division of the output signal of the voltage-controlled oscillator in order to obtain the timing signal and a shift register timed by the timing signal, configured to receive at its input the initial reference signal and to furnish at its output the control signal.

According to another aspect, a communication apparatus is proposed, including an antenna to receive/transmit a radio-frequency signal, a receiving chain and a transmission chain coupled to the antenna and each of them including a frequency transposition stage and at least one device such as is defined above, coupled to the frequency transposition stage.

This apparatus may be configured, for example, to receive/transmit a radio frequency signal in accordance with the standard IEEE 802.15.1 or the standard IEEE 802.15.4.

This apparatus may form, for example, a mobile cell phone or a tablet.

BRIEF DESCRIPTION OF THE DRAWINGS

Other advantages and characteristics of the invention will appear upon examining the detailed description of implementations and embodiments, in no way limiting, and the enclosed drawings, where:

FIGS. 1 to 4 illustrate different implementations and embodiments of the invention.

DETAILED DESCRIPTION OF ILLUSTRATIVE EMBODIMENTS

Figure 1:
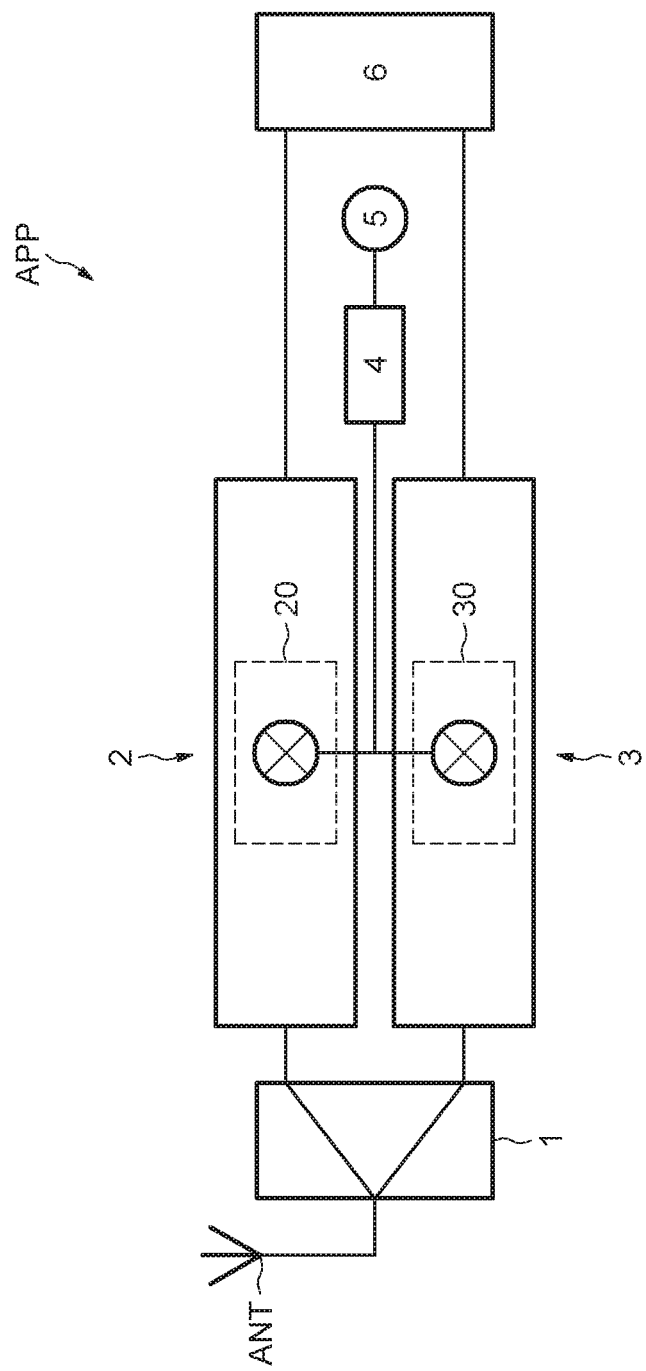

In FIG. 1, the reference APP denotes a communication apparatus, such as a mobile cell phone or a touch tablet, including an antenna ANT to send and receive a radio frequency signal, a reception chain 2 and a transmission chain 3 coupled to the antenna by a duplexer 1 and each one including a frequency transposition stage 20 and 30, respectively, configured to transpose the signals received or transmit with the aid of a transposition signal. The reception and transmission chains 2 and 3 are coupled to processor 6, such as a microprocessor, able to perform signal processing in the baseband, for example.

The transposition signal, or local oscillator signal, is furnished by an electronic device 4 including in particular a phase locked loop having a voltage-controlled oscillator and receiving an initial reference signal based on an external quartz 5, for example.

The radio frequency signal received or transmitted by the antenna can be, for example, a radio frequency signal according to the standard IEEE 802.15.1 (Bluetooth standard) or the standard 802.15.4 (Zigbee) or according to a near field type communication protocol (NFC). In this context, a signal complies with a standard if it is compliant with a version of the standard available on the priority date of this patent.

It shall now be assumed, as a non-limiting example, that the apparatus APP is configured to send and receive radio frequency signals according to BLE (Bluetooth Low Energy) with a local oscillator signal furnished by the device 4 having a frequency of 2.4 GHz and a quartz frequency 5 equal to 16 MHz.

Figure 2:
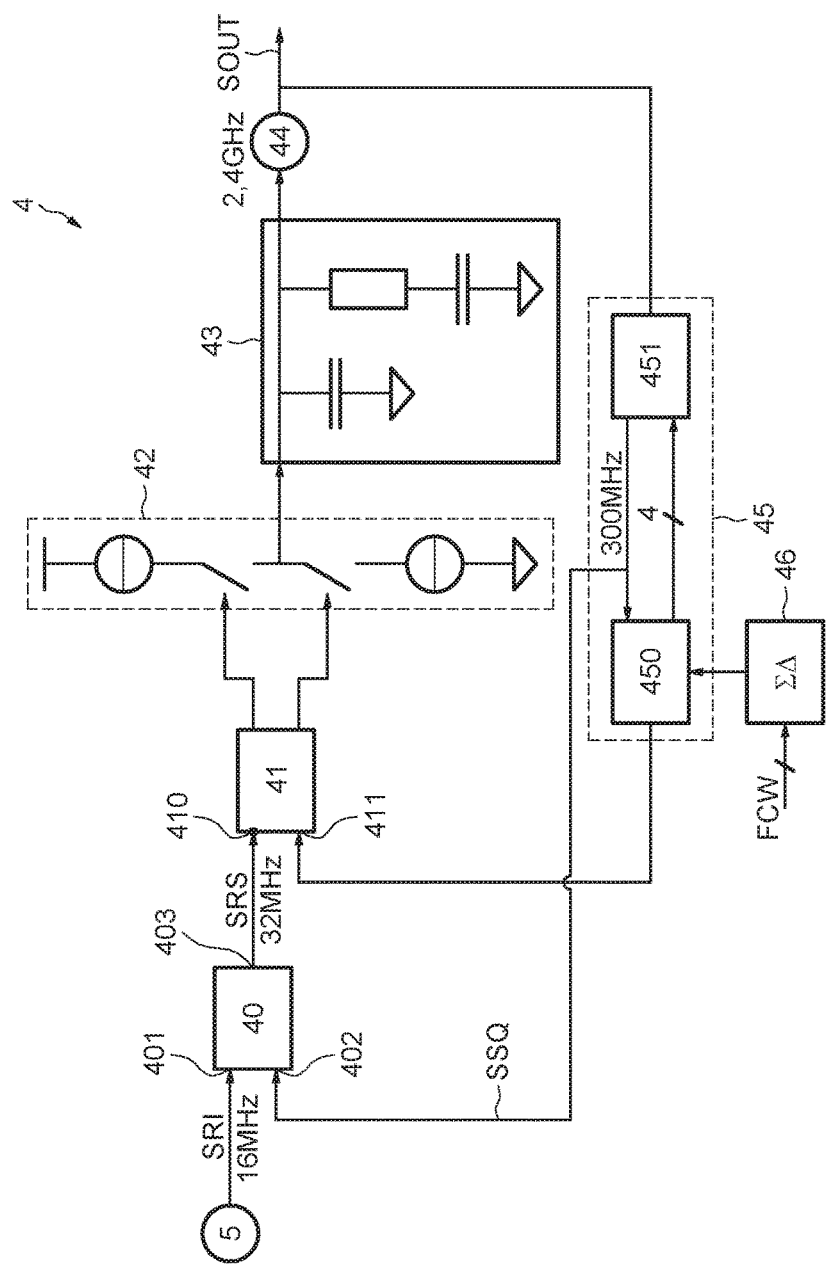
Figure 3:
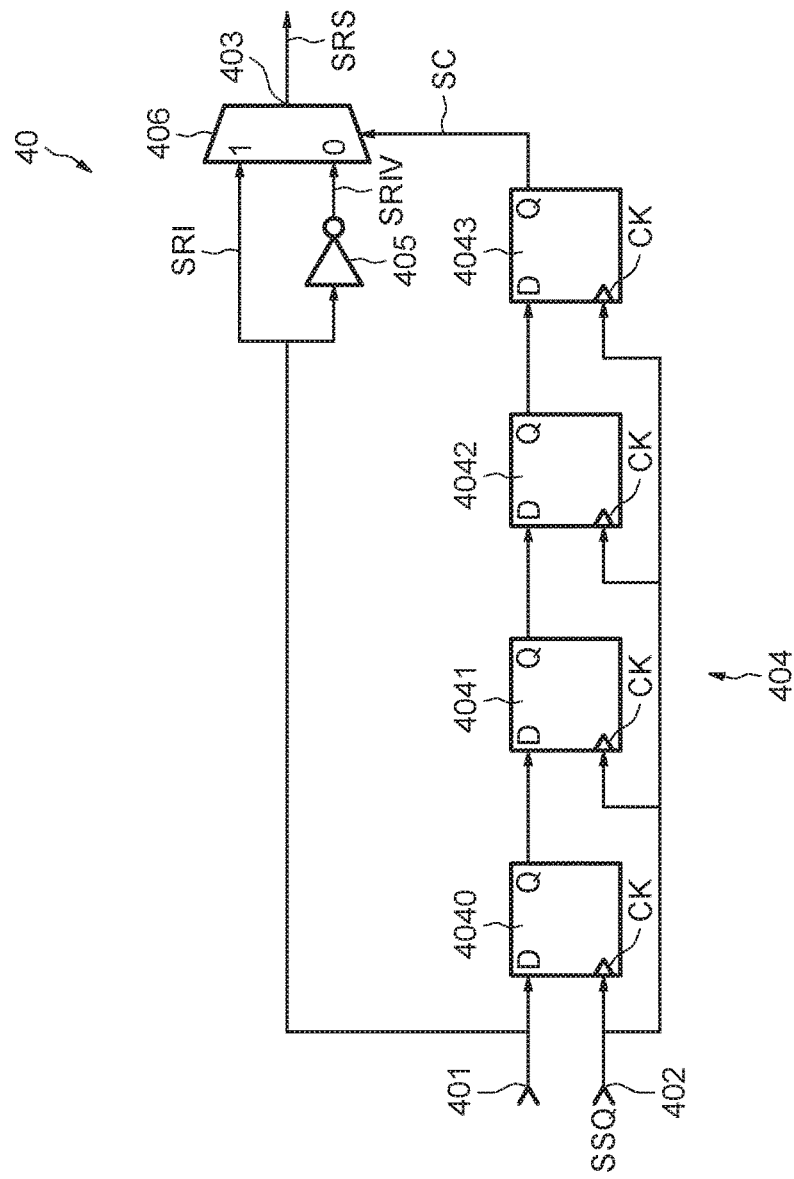

We shall now refer more particularly to FIGS. 2 to 4 in order to illustrate one embodiment of the device 4 as well as one implementation of a method for doubling of the frequency of the external quartz signal 5.

As shown in particular by FIG. 2, the electronic device 4 includes an input 401 to receive an initial reference signal SRI emitted by the external quartz 5 and having here the frequency of 16 MHz.

The electronic device 4 also includes a phase locked loop having a voltage-controlled oscillator 44 whose output is fed back to a first input 411 of a phase comparator 41 of classical structure known in itself and configured to operate here on the falling edges of a secondary reference signal SRS received at a second input 410 and having a doubled frequency with respect to that of the initial reference signal SRI, or a frequency of 32 MHz.

The output of the voltage-controlled oscillator 44 is fed back to the input 411 of the phase comparator 41 via a fractional divider 45 controlled by a delta-sigma modulator 46 of classical structure known in itself, which is itself controlled by a control signal FCW.

The loop further includes in classical manner a charge pump circuit 42 controlled by the outputs of the phase comparator 41, and a loop filter 43 connected between the charge pump circuit 42 and the input of the oscillator 44.

Furthermore, the device 4 includes signal generators 451 and 40 configured to generate the secondary reference signal SRS which, as can be seen in FIG. 4, has edges of a first type, here, falling edges FD2, synchronized to each of rising FM1 and falling FD1 edges of the initial reference signal SRI, and edges of a second type, in the present case rising edges FM2, situated between the falling edges FD2.

The signal generators, in particular the signal generator 40, is configured to furnish the secondary reference signal SRS at the second input 410 of the phase comparator 41.

In this regard, the signal generator 40 receives at the input 401 the initial reference signal SRI and at a second input 402 a sequencing signal SSQ resulting from a division of the signal SOUT furnished at the output of the oscillator 44.

In the example described here, the sequencing signal SSQ results from the signal SOUT furnished at the output of the oscillator 44 by a division of eight. The frequency of the signal SSQ is consequently equal here to 300 MHz. In other words, as illustrated in FIG. 4, the period of the sequencing signal SSQ is equal to 8 times the period $T_{SOUT}$ of the signal SOUT furnished at the output of the oscillator 44.

In order to simplify the embodiment, it is then particularly advantageous, as shown in FIG. 2, to use the first four stages of the fractional divider 45 to form signal generator 451, which in this case may be referred as the divider by eight 451, which will furnish the signal SSQ.

The other stages 450 of the fractional divider 45 will be controlled by the delta-sigma modulator 46.

The signal furnished at the output of the stages 450 and consequently at the input 411 of the phase comparator has a frequency equal on average to 32 MHz, given the division by 75 performed by the fractional frequency divider 45.

The signal generator 40 includes a shift register 404 having here a chain of four latches D respectively referenced as 4040, 4041, 4042 and 4043.

The data input D of the first latch 4040 forms the input 401 of the signal generator 40 to receive the initial reference signal SRI.

The data input D of each subsequent latch 4041, 4042 and 4043 is connected to the output Q of the preceding latch and the output Q of the last latch 4043 forms the output of the shift register 404 and furnishes a control signal SC.

Moreover, the shift register 404 is timed by the sequencing signal SSQ.

In fact, each of the clock inputs CK of the latches forms the input 402 of the signal generator 40, which receives the sequencing signal SSQ.

The divider 451 and the shift register 404 thus form a controller generating the control signal SC.

As illustrated in FIG. 4, the control signal SC is delayed by a delay DL equal to $$\frac{(1-\alpha)\cdot T}{2}$$

as compared to the initial reference signal SRI, where α denotes the duty cycle of the secondary reference signal SRS and T denotes the period of the initial reference signal SRI, which in the present case is equal to 150 times the period $T_{SOUT}$ of the signal SOUT furnished at the output of the oscillator 44.

Since the period of the secondary reference signal is equal to T/2, the duty cycle α of this signal SRS is equal to 2th/T where th is the duration in the high state of the signal SRS.

Consequently, the delay DL is equal to the duration tb of the secondary reference signal SRS in the low state.

This delay DL is also equal to the product of the number of latches D of the shift register 404 by the period of the sequencing signal SSQ.

In order to avoid any meta-stability problems, it is preferable to use several latches D so as to obtain a duty cycle of the secondary reference signal greater than or equal to 20% and less than or equal to 80%, and preferably equal to or close to 50%.

As illustrated in FIG. 3, the signal generator 40 further includes an inverter 405 whose input is connected to the input 401 of the signal generator 40 and whose output furnishes the inverted initial reference signal SRIV.

Furthermore, the signal generators include selector 406, in the present case a duplexer controlled by the control signal SC.

The input 1 of this duplexer is connected directly to the input 401 to receive the initial reference signal SRI while the input 0 is connected to the output of the inverter 405 to receive the inverted reference signal SRIV.

Thus, depending on the logical value of the signal SC, the secondary reference signal SRS will be either the initial reference signal or the inverted reference signal SRIV.

The structure just described thus makes it possible to realize in very simple manner, based on the output signal of the voltage-controlled oscillator and the initial reference signal, the secondary reference signal SRS whose frequency has been doubled with respect to that of the initial reference signal.

Thanks to this doubling of frequency, the noise contribution caused by the delta-sigma modulation has been greatly reduced, if not eliminated.

Even though the device 4 has been described above in relation to a transmitter/receiver compatible with the BLE standard, this device is suitable for any system using a divisional phase locked loop controlled by a delta-sigma modulation whose signal furnished at the output of the oscillator has a frequency at least 100 times greater than that of the external quartz furnishing the initial reference signal of the loop, and whose quantization noise brought to the output of the loop needs to be attenuated so as not to be considered a perturbing noise contribution.

Furthermore, although in the embodiments just described the phase comparator 41 operates on falling edges, it would be entirely possible to use a phase comparator operating on rising edges by switching the 1 and 0 inputs of the duplexer 406.

What is claimed is:

1. A method comprising:
receiving a first reference signal having a first frequency with a phase locked loop, the phase locked loop comprising a voltage-controlled oscillator having an output coupled to a first input of a phase comparator via a fractional divider, the fractional divider being controlled by a delta-sigma modulator;
generating a second reference signal based on the first reference signal and on an output signal of the voltage-controlled oscillator, the second reference signal having edges of a first type synchronized with each of the rising and falling edges of the first reference signal, and edges of a second type between the edges of the first type; and
providing the second reference signal to a second input of the phase comparator, the phase comparator operating on edges of the first type.

2. The method of claim 1, wherein the second reference signal has a second frequency, the second frequency being twice the first frequency.

3. The method of claim 1, wherein a duty cycle of the second reference signal is greater than or equal to 20% and less than or equal to 80%.

4. The method of claim 3, wherein the duty cycle is equal to about 50%.

5. The method of claim 1, wherein generating the second reference signal is further based on an inverted first reference signal and on a control signal, the control signal being generated based on the output signal of the voltage-controlled oscillator.

6. The method of claim 5, wherein generating the second reference signal comprises generating the second reference signal with a selector circuit having a first input receiving the first reference signal and a second input receiving the inverted first reference signal, the method further comprising selecting an output of the selector circuit with the control signal.

7. The method of claim 5, wherein the control signal is delayed by a delay equal to $$\frac{(1-\alpha) \cdot T}{2}$$

with respect to the first reference signal, wherein $\alpha$ denotes a duty cycle of the second reference signal and T denotes a period of the first reference signal.

8. The method of claim 5, further comprising generating the control signal, wherein generating the control signal comprises
generating a timing signal by dividing the output signal of the voltage-controlled oscillator;
providing the first reference signal at an input of a shift register timed by the timing signal; and
providing the control signal with an output of the shift register providing the control signal.

9. The method of claim 1, wherein a ratio of a frequency of the output signal of the voltage-controlled oscillator to the first frequency is at least equal to 100.

10. The method of claim 1, wherein a frequency of the output signal of the voltage-controlled oscillator is equal to 2.4 GHz and the first frequency is equal to 16 MHz.

11. A device comprising:
an input configured to receive a first reference signal, the first reference signal having a first frequency; and
a phase locked loop comprising:
a voltage-controlled oscillator having an output,
a phase comparator having a first input coupled to the output of the voltage-controlled oscillator via a fractional divider, the fractional divider configured to be coupled to a delta-sigma modulator, and
a signal generator coupled to the input of the device and to the output of the voltage-controlled oscillator, the signal generator configured to
generate a second reference signal having edges of a first type synchronized with each of the rising and falling edges of the first reference signal and edges of a second type between the edges of the first type, and
provide the second reference signal to a second input of the phase comparator, the phase comparator configured to operate on the edges of the first type.

12. The device of claim 11, wherein a duty cycle of the second reference signal is greater than or equal to 20% and less than or equal to 80%.

13. The device of claim 12, wherein the duty cycle is equal to 50%.

14. The device of claim 11, wherein the signal generator comprises
an inverter coupled to the input of the device, the inverter configured to generate an inverted first reference signal;
a controller configured to generate a control signal based on the output of the voltage-controlled oscillator; and
a selector circuit configured to select the first reference signal or the inverted first reference signal to generate the second reference signal, wherein the control signal is configured to control the selector circuit.

15. The device of claim 14, wherein the controller is configured to generate the control signal delayed by a delay equal to $$\frac{(1-\alpha) \cdot T}{2}$$

in relation to the first reference signal, wherein $\alpha$ denotes a duty cycle of the second reference signal and T is a period of the first reference signal.

16. The device of claim 14, wherein the controller comprises:
a divider circuit configured generate a timing signal by dividing a signal at the output of the voltage-controlled oscillator; and
a shift register having an input and an output and configured to be timed by the timing signal, the shift register having configured to receive the first reference signal at the input of the shift register and to generate the control signal at the output of the shift register.

17. The device of claim 11, wherein a ratio of a frequency of the output of the voltage-controlled oscillator to the first frequency is greater than or equal to 100.

18. A communication apparatus comprising:
an antenna configured to receive/transmit a radio-frequency signal;
a receiving chain coupled to the antenna, the receiving chain comprising a first frequency transposition stage; and
a transmission chain coupled to the antenna, the transmission chain comprising a second frequency transposition stage; and a device coupled to the first and second frequency transposition stages, the device comprising:
  an input configured to receive a first reference signal, the first reference signal having a first frequency, and
a phase locked loop comprising:
  a voltage-controlled oscillator having an output,
  a phase comparator having a first input coupled to the output of the voltage-controlled oscillator via a fractional divider, the fractional divider configured to be coupled to a delta-sigma modulator, and
  a signal generator coupled to the input of the device and to the output of the voltage-controlled oscillator, the signal generator configured to
    generate a second reference signal having edges of a first type synchronized with each of the rising and falling edges of the first reference signal and edges of a second type between the edges of the first type, and
    provide the second reference signal to a second input of the phase comparator, the phase comparator configured to operate on the edges of the first type.

19. The apparatus of claim 18, configured to receive/transmit a radio frequency signal in accordance with standard IEEE 802.15.1 or standard IEEE 802.15.4.

20. The apparatus of claim 19, forming a mobile cell phone or a tablet.

* * * * *